(12) United States Patent
McClellan et al.

(10) Patent No.: US 7,955,091 B2
(45) Date of Patent: Jun. 7, 2011

(54) CONNECTOR ASSEMBLY HAVING ALIGNMENT MEMBERS FOR HOLDING A MODULE

(75) Inventors: Justin Shane McClellan, Camp Hill, PA (US); Nathan William Swanger, Mechanicsburg, PA (US); Jason M'Cheyne Reisinger, Carlisle, PA (US); Jeffrey Byron McClinton, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/490,197

(22) Filed: Jun. 23, 2009

(65) Prior Publication Data

US 2010/0323538 A1 Dec. 23, 2010

(51) Int. Cl.
*H01R 12/00* (2006.01)
(52) U.S. Cl. .................................... 439/71; 439/66
(58) Field of Classification Search .............. 439/70, 439/71, 66, 74
See application file for complete search history.

(56) References Cited

U.S. PATENT DOCUMENTS

| | | | |
|---|---|---|---|
| 5,446,960 A | 9/1995 | Isaacs et al. | |
| 5,691,041 A | 11/1997 | Frankeny et al. | |
| 5,885,101 A | 3/1999 | Matsuoka et al. | |
| 6,181,149 B1 | 1/2001 | Godfrey et al. | |
| 6,198,630 B1 | 3/2001 | Cromwell | |
| 6,325,638 B1 | 12/2001 | Chapin et al. | |
| 7,044,783 B2 * | 5/2006 | Fan | 439/567 |
| 7,121,865 B2 | 10/2006 | Bryant | |
| 7,195,493 B1 | 3/2007 | Polnyi | |
| 2002/0182901 A1 | 12/2002 | Koopman et al. | |
| 2004/0088121 A1 | 5/2004 | Colbert et al. | |
| 2005/0124185 A1 * | 6/2005 | Cromwell et al. | 439/71 |
| 2006/0160379 A1 * | 7/2006 | Rathburn | 439/66 |
| 2007/0269997 A1 * | 11/2007 | Eldridge et al. | 439/66 |
| 2007/0275573 A1 * | 11/2007 | Ju | 439/67 |
| 2008/0113854 A1 * | 5/2008 | Ferri | 482/148 |
| 2008/0239683 A1 | 10/2008 | Brodsky et al. | |
| 2008/0272480 A1 | 11/2008 | Hung et al. | |
| 2010/0029102 A1 * | 2/2010 | Chen et al. | 439/66 |
| 2010/0167562 A1 * | 7/2010 | Polnyi et al. | 439/71 |

OTHER PUBLICATIONS

Ball Grid Array (BGA) Packaging, 2000 Packaging Databook Intel®, 32 pgs.
J. S. Corbin, et al; "Land grid array sockets for server applications", IBM J. Res. & Dev, vol. 46 No. 6 Nov. 2002, 16 pgs.
One Piece Compression Interfaces, Land Grid Array (LGA) Interfaces, Samtec, 2pgs.

* cited by examiner

*Primary Examiner* — Hien Vu (57) ABSTRACT

An electrical connector for electrically coupling an electronic module and an electrical component. The connector includes a substrate that has first and second surfaces separated by a thickness. The substrate includes interconnects that extend through the substrate and are arranged in an array. The interconnects are configured to engage the module along the first surface and engage the electrical component along the second surface. The connector also includes alignment members that extend through openings in the substrate. The alignment members include heads that project beyond and away from the first surface. The heads are located about the substrate relative to each other to collectively form a module reception area therebetween to hold the module in a predetermined position and orientation with respect to the first surface and with respect to the interconnects.

18 Claims, 9 Drawing Sheets

CONNECTOR ASSEMBLY HAVING ALIGNMENT MEMBERS FOR HOLDING A MODULE

BACKGROUND OF THE INVENTION

The invention relates generally to connector assemblies, and more particularly to surface mount connector assemblies configured to hold an electronic module in a predetermined position and orientation.

Surface mount technologies, such as land-grid array (LGA) assemblies and ball-grid array (BGA) assemblies, involve mounting an electronic module onto a printed circuit board (PCB). For example, in an LGA assembly, the module is mounted onto an interposer, which, in turn, is mounted onto a PCB. The module and the PCB each have contacts along their respective surfaces that mate with the interposer, and the interposer has conductive pathways that electrically couple the contacts of the module to corresponding contacts of the PCB. In conventional LGA assemblies, a unitary frame is mounted onto the PCB and is configured to completely surround the interposer. When the module is mounted onto the interposer, the module is held by the frame in a predetermined position and orientation (i.e., a mounted position) alongside the interposer.

However, the frames are typically constructed from a hard, metallic material that completely surrounds the interposer. If the interposer, the module, and/or the PCB are not each precisely manufactured to specification, the components may be misaligned or not properly oriented with respect to each other. Forcing the components into the proper positions may damage the components or, more specifically, the contacts on the components.

Furthermore, in order to maintain the connection between the contacts on the module and the conductive pathway of the interposer, a force is applied to the module and/or PCB to compress the module, interposer, and PCB together. Additional parts may be used to create this force, which may also increase the cost of the assembly or damage the components.

Accordingly, there is a need for a connector assembly that will properly align and hold an electronic module in a mounted position. Furthermore, there is a need for alternative methods and features that facilitate aligning and holding the components of a connector assembly.

BRIEF DESCRIPTION OF THE INVENTION

In one embodiment an electrical connector for electrically coupling an electronic module and an electrical component is provided. The connector includes a substrate that has first and second surfaces separated by a thickness. The substrate includes interconnects that extend through the substrate and are arranged in an array. The interconnects are configured to engage the module along the first surface and engage the electrical component along the second surface. The connector also includes alignment members that extend through openings in the substrate. The alignment members include heads that project beyond and away from the first surface. The heads are located about the substrate relative to each other to collectively form a module reception area therebetween to hold the module in a predetermined position and orientation with respect to the first surface and with respect to the interconnects.

Optionally, the heads may form an interference fit with the module. The heads may also include a lateral surface that engages the module. The lateral surface may form an obtuse angle with respect to the first surface. Also, the heads may include an elastic material that engages and forms an interference fit with the module. Also optionally, at least one alignment member may extend through the substrate and have a tail that projects beyond and away from the second surface. The tail may be configured to be inserted into a hole of the electrical component.

In another embodiment, an electrical connector assembly is provided. The connector assembly includes an electronic module that has mating contacts that extend along a muting lace of the module and an electrical component that has mating contacts that extend along a mating face of the electrical component. The connector assembly also includes an electrical connector mounted onto the electrical component. The connector includes a substrate that has first and second surfaces separated by a thickness. The substrate includes interconnects that extend through the substrate and are arranged in an array. The interconnects are configured to engage the module along the first surface and engage the electrical component along the second surface. The connector also includes alignment members that extend through openings in the substrate. The alignment members include heads that project beyond and away from the first surface. The heads are located about the substrate relative to each other to collectively form a module reception area therebetween to hold the module in a predetermined position and orientation with respect to the first surface and with respect to the interconnects.

DETAILED DESCRIPTION OF THE INVENTION

Figure 1:
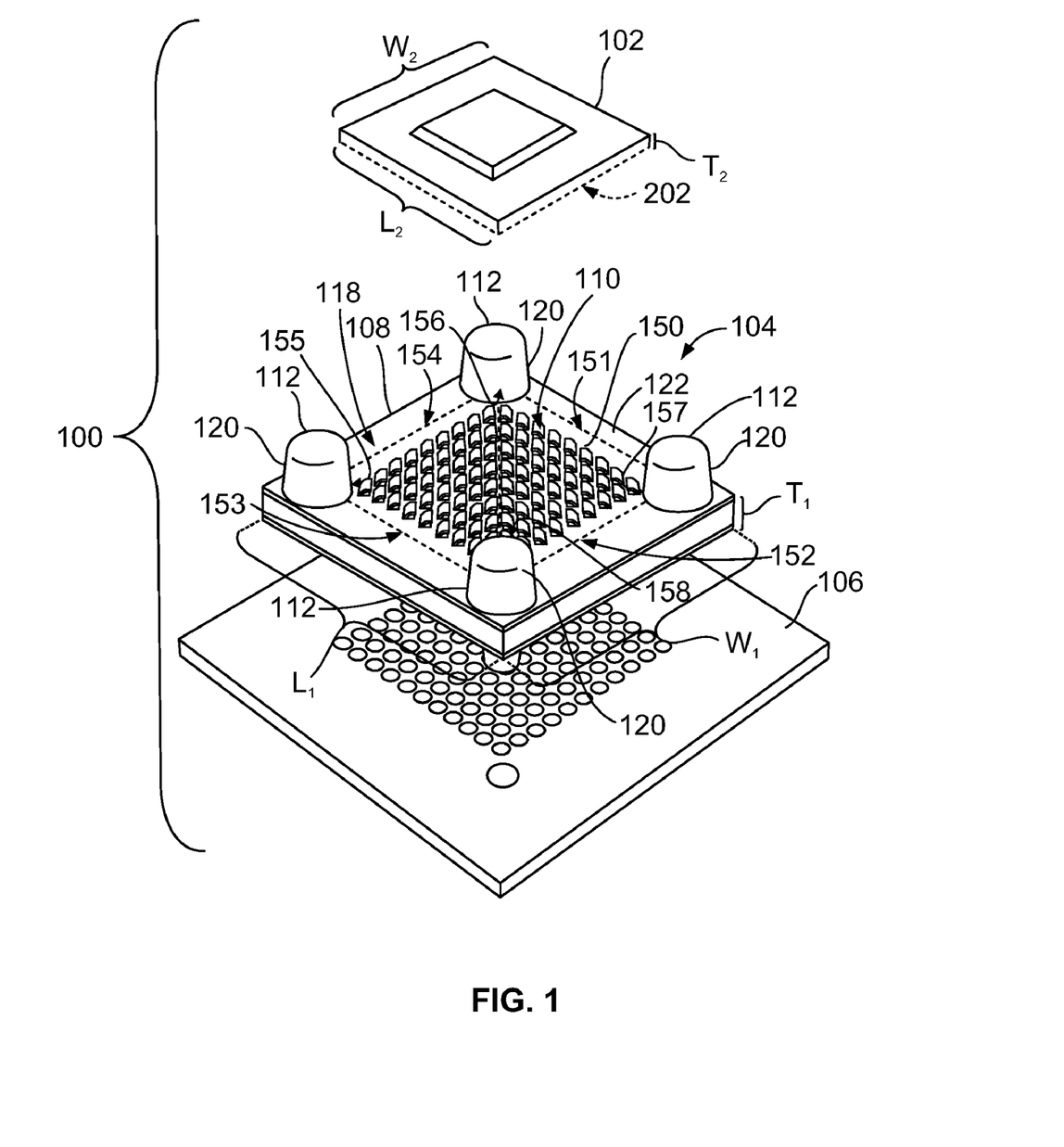
FIG. 1 is an exploded view of an electrical connector assembly formed in accordance with one embodiment.
Figure 4:
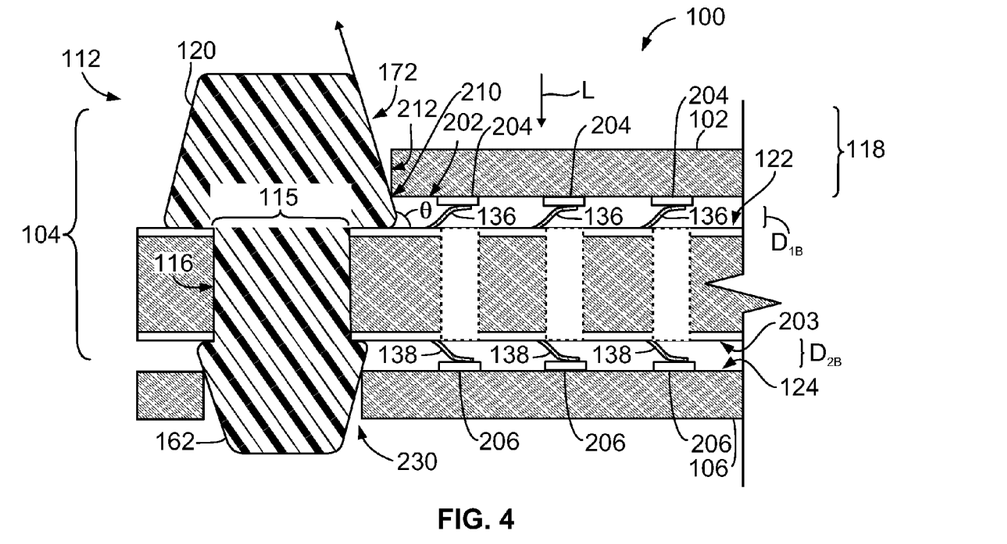
FIG. 4 is a side cross-sectional view of a portion of the connector assembly when a module is in a mounted position.

FIG. 1 is an exploded view of an electrical connector assembly 100 formed in accordance with one embodiment. The connector assembly 100 includes an electronic module 102, an electrical connector 104, and an electrical component 106, which is illustrated as a printed circuit board (PCB). The connector 104 includes an interposer or substrate 108 having a thickness $T_1$ and an array of interconnects 110 extending therethrough. When the connector assembly 100 is fully assembled, the module 102, the connector 104, and the electrical component 106 are stacked upon each other as shown in FIG. 4. The interconnects 110 electrically couple the module 102 and the electrical component 106 in communication with each other. As will be discussed in greater detail below, the connector 104 includes a plurality of alignment members 112 that extend from the substrate 108. In some embodiments, the substrate 108 may include openings 115 (shown in FIG. 4) that may lead into holes 116 (shown in FIG. 4) that extend a depth into or completely through the substrate 108. Each hole 116 may receive a corresponding alignment member 112. The alignment members 112 may include a head 120 that projects away from the substrate 108. The heads 120 may be located relative to each other in order to collectively form a module reception area 118 therebetween to hold the module 102 in a predetermined position and orientation with respect to the substrate 108 and with respect to the interconnects 110. Furthermore, in some embodiments, the heads 120 may be formed from or include an elastic material that engages and forms an interference fit with the module 102.

It is to be understood that the benefits herein described are also applicable to other connectors and connector assemblies. In the illustrated embodiment, the connector assembly 100 is a land grid array (LGA) assembly. However, benefits of the features described herein may be used with other surface mount technologies and connector assemblies. Furthermore, the connector assembly 100 is not limited to the number or type of parts shown in FIG. 1, but may include or operate in conjunction with additional parts that are not shown, such as a board stiffener and heat sink. Thus, the following description is provided for purposes of illustration, rather than limitation, and is but one potential application of the subject matter herein.

The module 102 may be a circuit board or another type of electronic package that is configured to perform one or more functions. In the illustrated embodiment, the module 102 has a mating face 202 that includes an array of mating contacts 204 thereon (shown in FIG. 4) that are configured to engage the array of interconnects 110. The connector 104 is configured to receive and hold the module 102 in a mounted position (shown in FIG. 4), where the module 102 has a predetermined position and orientation relative to the substrate 108. The module 102 may have a substantially rectangular body that includes a length $L_2$, a width $W_2$, and a thickness $T_2$. The alignment members 112 are arranged relative to each other on the substrate 108 in order to hold module 102 in the mounted position.

Also shown in FIG. 1, the substrate 108 of the connector 104 has a length $L_1$ and a width $W_1$. The substrate 108 may include a contact zone or region 150 (indicated by a hashed outline) along a top surface 122 and a contact zone or region (not shown) along a bottom surface 124 (shown in FIG. 2) where the array of interconnects 110 is located. In some embodiments, the reception area 118 is located directly above the contact region 150 and has a similar shape as the contact region 150. The contact regions may have a polygonal shape (e.g., rectangular) along the corresponding surface. For example, the contact region 150 may include sides 151-154 that intersect each other at corners 155-158. Alternatively, the contact region 150 may have other geometric shapes, including other polygonal shapes and circular or semi-circular shapes. In the illustrated embodiment, the alignment members 112 are positioned to surround the contact region 150. For example, the alignment members 112 may be located proximate to the corners 155-158 as shown. Alternatively, the alignment members 112 may be located proximate to the sides 151-154. As will be described further below, when the module 102 is received within the reception area 118 and held by the alignment members 112 in the mounted position, the mating face 202 may extend alongside the contact region 150 along the top surface 122 so that the mating contacts 204 of the module 102 engage the interconnects 110.

Figure 2:
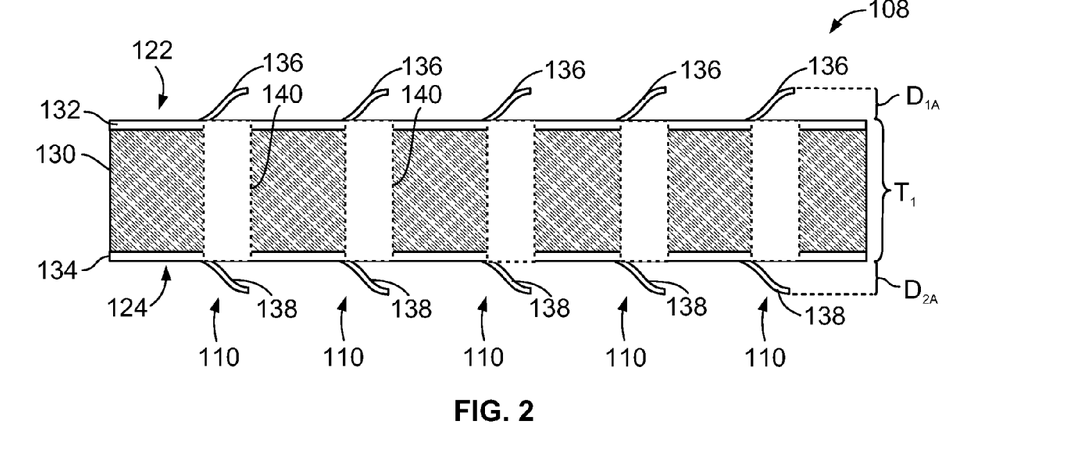
FIG. 2 is a side cross-sectional view of a substrate that may be used with the connector assembly shown in FIG. 1.

FIG. 2 is a side cross-sectional view of a portion of the substrate 108. In the illustrated embodiment, the substrate 108 includes multiple layers that form a substantially planar body including the contact layers 132 and 134 and a base layer 130. The top and bottom surfaces 122 and 124 may extend substantially parallel to one another such that the thickness $T_1$ remains constant throughout the substrate 108. The contact layers 132 and 134 may be flexible circuits formed with contacts 136 and 138, respectively. The base layer 130 may be fabricated from a non-conductive or PCB-like material and may be sandwiched between the contact layers 132 and 134.

The interconnects 110 provide a conductive pathway so that a mating contact 204 (FIG. 4) on the module 102 (FIG. 1) and a corresponding mating contact 206 (FIG. 4) on the electrical component 106 (FIG. 1) may communicate with each other therebetween. As shown, the interconnects 110 may extend through the thickness $T_1$ of the substrate 108 and include the contacts 136 and 138 and a trace or via 140. The contacts 136 and 138 may be resilient beams as shown in FIG. 2 that flex away from the corresponding surface. Alternatively, the contacts 136 and/or 138 may be contact pads or protrusions. The contacts 136 and 138 are configured to engage mating contacts 204 of the module 102 and mating contacts 206 of the electrical component 106. Each contact 136 is electrically coupled to a corresponding contact 138 through the trace or via 140.

However, the interconnects 110 may have various configurations for providing a conductive pathway other than the interconnects 110 shown in FIG. 2. For example, the contacts 136 and 138 may be used without the contact layers 132 and 134. Also, the contacts 136 and 138 may not be single beams, but may be, for example, contact pads, solder balls, or dual-beams. In alternative embodiments, the substrate 108 may include cavities where flexible socket contacts are located. The socket contacts may include, for example, a solder ball that is configured to couple to the electrical component 106 and a beam that projects out of the cavity to engage the module 102. Also, in the illustrated embodiment, the via 140 extends directly across the thickness $T_1$ from one contact 136 to the corresponding contact 138. However, in alternative embodiments, the via 140 may take various paths through or along the substrate 108 to couple to the corresponding contacts.

FIG. 2 illustrates the contacts 136 and 138 in an uncompressed condition or state. As shown, the contacts 136 project a distance $D_{1A}$ away from the top surface 122. The distance $D_{1A}$ is measured from the top surface 122 to a distal portion of each contact 136 that faces away from the top surface 122. The distance $D_{1A}$ may be configured to assure that the contacts 136 electrically couple to the corresponding mating contacts on the module 102 if the module 102 is slightly misoriented and/or improperly positioned with respect to the top surface 122. Likewise, the contacts 138 project a distance $D_{2A}$ away from the bottom surface 124. The distance $D_{2A}$ is measured from the bottom surface 124 to a distal portion of each contact 138 that faces away from the bottom surface 124. The distance $D_{2A}$ may be configured so that the contacts 138 electrically couple to the corresponding mating contacts on the electrical component 106 even if the electrical component 106 and substrate 108 are slightly misoriented and/or improperly positioned with respect to each other.

Figure 3:
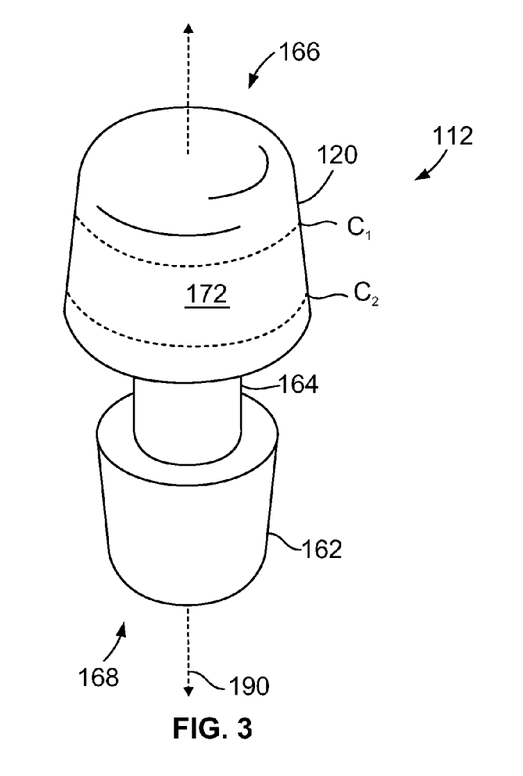
FIG. 3 is an isolated perspective view of an alignment member that may be used with the connector assembly shown in FIG. 1.

FIG. 3 is an isolated perspective view of the alignment member 112. As shown, the alignment member 112 may extend along a central axis 190 between two ends 166 and 168. The alignment member 112 may include the head 120 and, optionally, a tail 162. The head 120 and the tail 162 may be joined by a post 164 that is sized and shaped to fit within one of the holes 116 (FIG. 4). Furthermore, the tail 162 may be sized and shaped to be inserted into a hole 230 (FIG. 4) of the electrical component 106 (FIG. 1). However, as will be discussed in greater detail below with respect to FIGS. 6-12, the alignment members may have different shapes and configurations than the alignment member shown in FIG. 3.

Furthermore, the heads 120 may be sized and shaped to collectively receive the module 102 and hold the module 102 in the predetermined position and orientation when the module 102 is mounted onto the connector 104. By way of example, the head 120 may have a substantially frustro-conical shape. The head 120 may include a lateral surface 172 that circumferentially surrounds the axis 190 and is configured to engage the module 102. For example, when the module 102 is mounted onto the connector 104, a corner edge 210 or side surface 212 (shown in FIG. 4) of the module 102 may engage the lateral surface 172. Collectively, the heads 120 may form an interference fit with the module 102. Also shown, the head 120 may have cross-sections $C_1$ and $C_2$ that are formed by planes (not shown) that are perpendicular to the axis 190 and intersect the head 120. The cross-sections $C_1$ and $C_2$ may be similarly shaped (e.g., circular) where the cross-section $C_1$ is smaller than the cross-section $C_2$. More specifically, as the head 120 extends from the end 166 toward the end 168, the cross-sections increase in size. In one embodiment, the shape of the head 120 is rotationally symmetric about the axis 190. The post 164 may also be rotationally symmetric about the axis 190. In such embodiments, the alignment members 112 may be rotatable about the axis 190 within the corresponding hole 116.

The optional tail 162 may have any suitable shape to facilitate coupling and/or aligning the contacts 138 (FIG. 2) with respect to the electrical component 106 (FIG. 1). For example, the tail 162 may also have a substantially frustro-conical shape. In some embodiments, one or more tails 162 of the alignment members 112 may differ in size and/or shape than other tails 162. In such embodiments, the differently dimensioned tails 162 may facilitate orienting the connector 104 before the connector 104 is mounted onto the electrical component 106.

In one embodiment, the alignment member 112 is formed from an elastic material. For example, the alignment member 112 may be formed within the substrate 108 (FIG. 1) by a molding process. For example, a resin may be injected into a shell or housing that surrounds the hole 116 and has a cavity shaped to form the head 120, the post 164, and, optionally, the tail 162. However, in alternative embodiments, the alignment member 112 may be formed from other materials and with other processes. For example, the alignment member 112 may be formed by machining metal. Also, the alignment members 112 may be formed from multiple parts. As an example, the alignment members 112 may be assembled from metal parts and elastic parts, such as the alignment members 312, 412, and 512 described below.

Alternatively, the alignment members 112 may not be separate parts from the substrate 108 but may be formed integrally with the substrate 108. Also, the post 164 is not required to extend completely through the thickness $T_1$ (FIG. 1) of the substrate 108, but may only extend a depth that is only partially therein or just beyond the opening 115 (FIG. 4).

FIG. 4 is a cross-sectional side view of a portion of the connector assembly 100 when the connector assembly 100 is fully assembled. As shown, the connector 104 may be mounted onto the electrical component 106. The tail 162 maybe inserted into the hole 230 in the electrical component 106 and form an interference fit therein. When the connector 104 is mounted onto the electrical component 106, the contacts 138 along the bottom surface 124 engage and electrically couple to the mating contacts 206 that extend along the mating face 203 of the electrical component 106. In the illustrated embodiment, as the bottom surface 124 is moved in a loading direction (indicated by the arrow L) toward the mating face 203, the contacts 138 engage the mating contacts 206 and are moved toward the bottom surface 124. As such, the contacts 138 are moved to a distance $D_{2B}$ away from the bottom surface 124. The distance $D_{2B}$ measured from the bottom surface 124 to the distal portion of the contact 138 that faces away from bottom surface 124. Because the contacts 138 are partially compressed, the distance $D_{2B}$ is less than the distance $D_{2A}$ (FIG. 2). Thus, the bottom surface 124 and the mating face 203 may extend alongside each other and be substantially parallel to each other with a spacing therebetween. In alternative embodiments, the contacts 138 may be completely compressed against the bottom surface 124 such that the bottom surface 124 and the mating face 203 are directly adjacent to or abutting each other.

Before or after the connector 104 is mounted to the electrical component 106, the module 102 may be mounted to the connector 104. The module 102 may be moved in the loading direction L toward the top surface 122. The module 102 may include the corner edge 210 that is formed by the joining of the side surface 212 and the mating face 202. As the module 102 is moved in the loading direction L, the corner edge 210 may engage and slide along the lateral surface 172 of the alignment member 112. The lateral surface 172 may be shaped to direct the module 102 into the mounted position.

When the module 102 is moved into the mounted position, the contacts 136 engage the mating contacts 204 and are moved toward the top surface 122. When in the mounted position, the contacts 136 may be flexed a distance $D_{1B}$ away from the top surface 122. The distance $D_{1B}$ is measured from the top surface 122 to the distal portion of the contact 136 that faces away from top surface 122. Because the contacts 136 are partially compressed, the distance $D_{1B}$ is less than the distance $D_{1A}$ (FIG. 2). As shown, the distance $D_{1B}$ provides a substantial spacing between the mating contact 204 and the top surface 122. Thus, the top surface 122 and the mating face 202 may extend alongside each other and be substantially parallel to each other with a spacing therebetween. In alternative embodiments, the contacts 136 may be completely compressed against the top surface 122 such that the top surface 122 and the mating face 202 are directly adjacent to or abutting each other.

At least a portion of each lateral surface 172 of each head 120 may face inward toward the contact region 150 (FIG. 1) and engage the module 102. The reception area 118 includes the space between the heads 120 where the heads 120 engage the module 102. As shown, the lateral surface 172 may form an angle θ with respect to the top surface 122. In the illustrated embodiment the angle θ may be an obtuse angle. An "obtuse angle," as used herein, is an angle that is greater than 90° but less than 180°. As shown in FIG. 4, the angle θ is a slightly obtuse angle, which may be, for example, approximately 95°. The slightly obtuse angle θ formed by the top surface 122 and the lateral surface 172 may facilitate directing the module 102 into the mounted position. Furthermore, the slightly obtuse angle θ may facilitate generating friction between the lateral surface 172 and the corner edge 210 and the side surface 212 when the module 102 approaches the mounted position. As such, the lateral surfaces 172 of the heads 120 may collectively form an interference fit with the module 102 when in the mounted position.

In the illustrated embodiment, the head 120 is fabricated from an elastic material (e.g., rubber), which may have a coefficient of friction that facilitates holding the module 102 in the mounted position. Furthermore, the elastic material along the lateral surface 172 may slightly conform to the corner edge 210 and the side surface 212. As such, an amount of surface area in which the module 102 and the lateral surface 172 contact each other may be greater than an amount of surface area where the lateral surface is not an elastic material.

Figure 5:
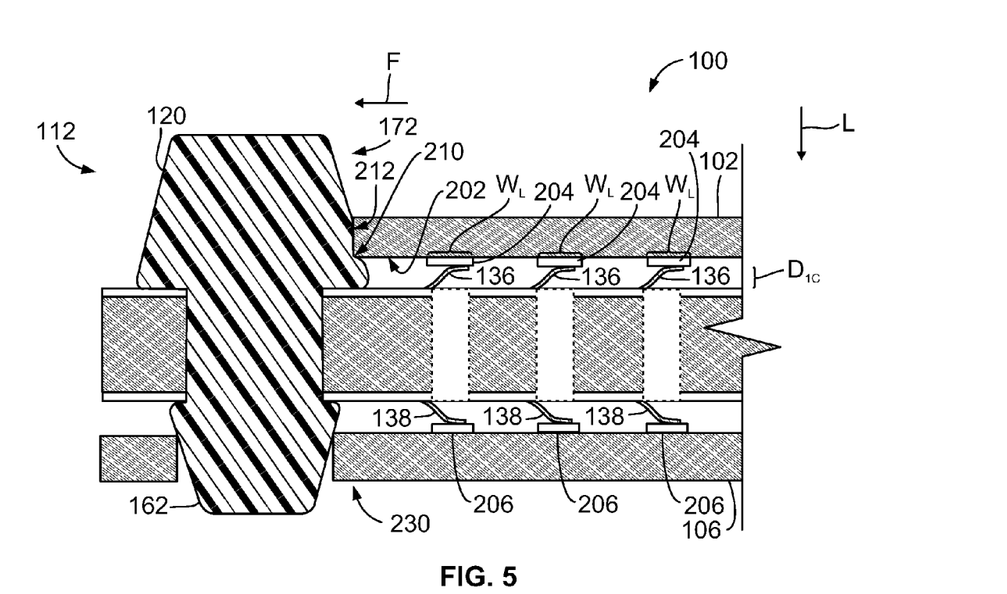
FIG. 5 is the side cross-sectional view of the portion of the connector assembly when the module is not manufactured precisely to specification.

FIG. 4 illustrates a portion of the connector assembly 100 when the module 102 is manufactured precisely to specification. FIG. 5 is a cross-sectional side view of a portion of the connector assembly 100 when the module 102 is not manufactured precisely to specification. For example, the length $L_2$ (FIG. 1) or the $W_2$ (FIG. 1) of the module 102 in FIG. 5 may be slightly greater than the length $L_2$ or $W_2$ of the module 102 shown in FIG. 4. As such, when the module 102 is moved in the loading direction L, the corner edge 210 and side surface 212 may engage the lateral surface 172 of the alignment member 112 earlier (i.e., further away from the top surface 122) than the example described above with respect to FIG. 4.

Embodiments described herein may facilitate electrically coupling the mating contacts 204 to the corresponding contacts 136 even if the module 102 is not manufactured precisely to specification. For example, in such embodiments where the contacts 136 include beams, the distance $D_{1A}$ of the contacts 136 and a wipe length $W_L$ of the mating contacts 204 may be configured to assure that the mating contacts 204 electrically couple to the contacts 136 even if the spacing between the top surface 122 and the mating contacts 204 is greater than or less than the distance $D_{1B}$ shown in FIG. 4. For example, in FIG. 5, the spacing between the top surface 122 and the distal portion of the contacts 136 is equal to a distance $D_{1C}$, which may be greater than or less than the distance $D_{1B}$.

Furthermore, in such embodiments where the alignment members 112 are formed from an elastic material or include an elastic member, such as those described below, the elasticity of the head 120 may allow the module 102 to be forced into the proper mounted position. As shown in FIG. 5, the side surface 212 and the corner edge 210 may exert an outward force F against the lateral surface 172. The outward force F compresses the elastic material of the head 120, thereby allowing the module 102 to be positioned closer to the top surface 122.

Figure 6:
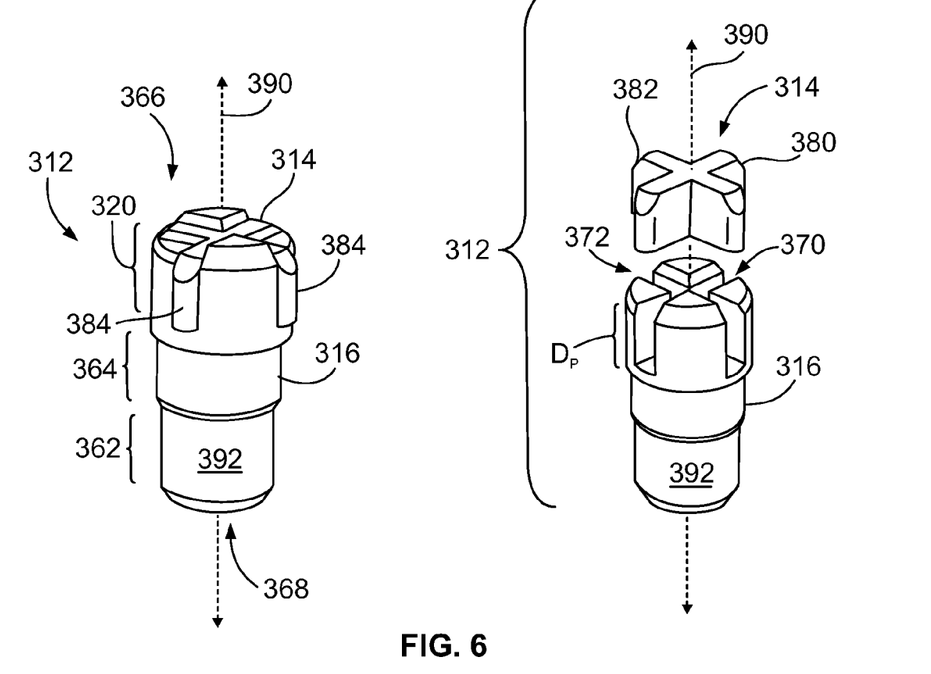
FIG. 6 illustrates an alignment member that may be used with the connector assembly in an alternative embodiment.
Figure 7:
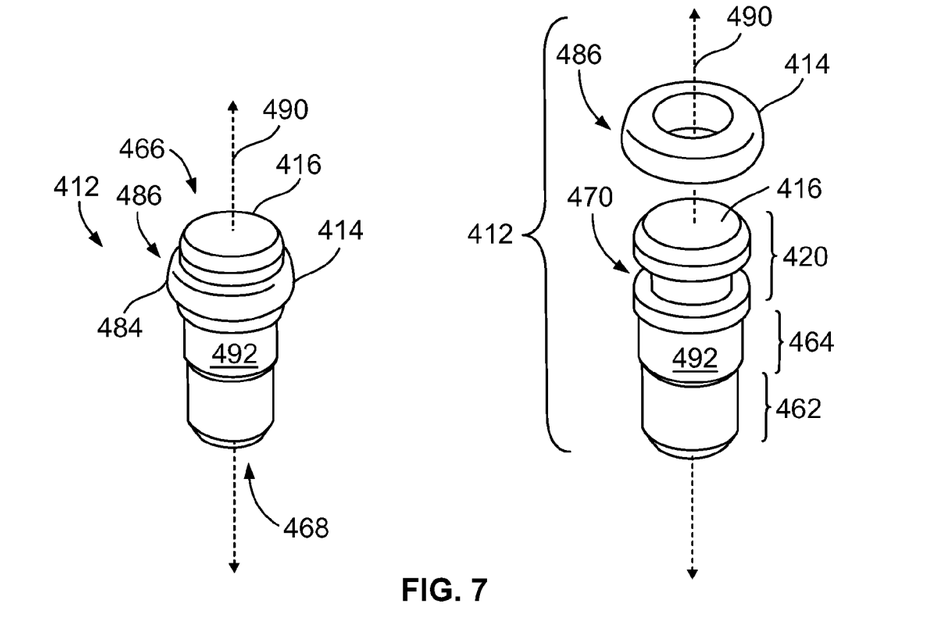
FIG. 7 illustrates another alignment member that may be used with the connector assembly in an alternative embodiment.
Figure 8:
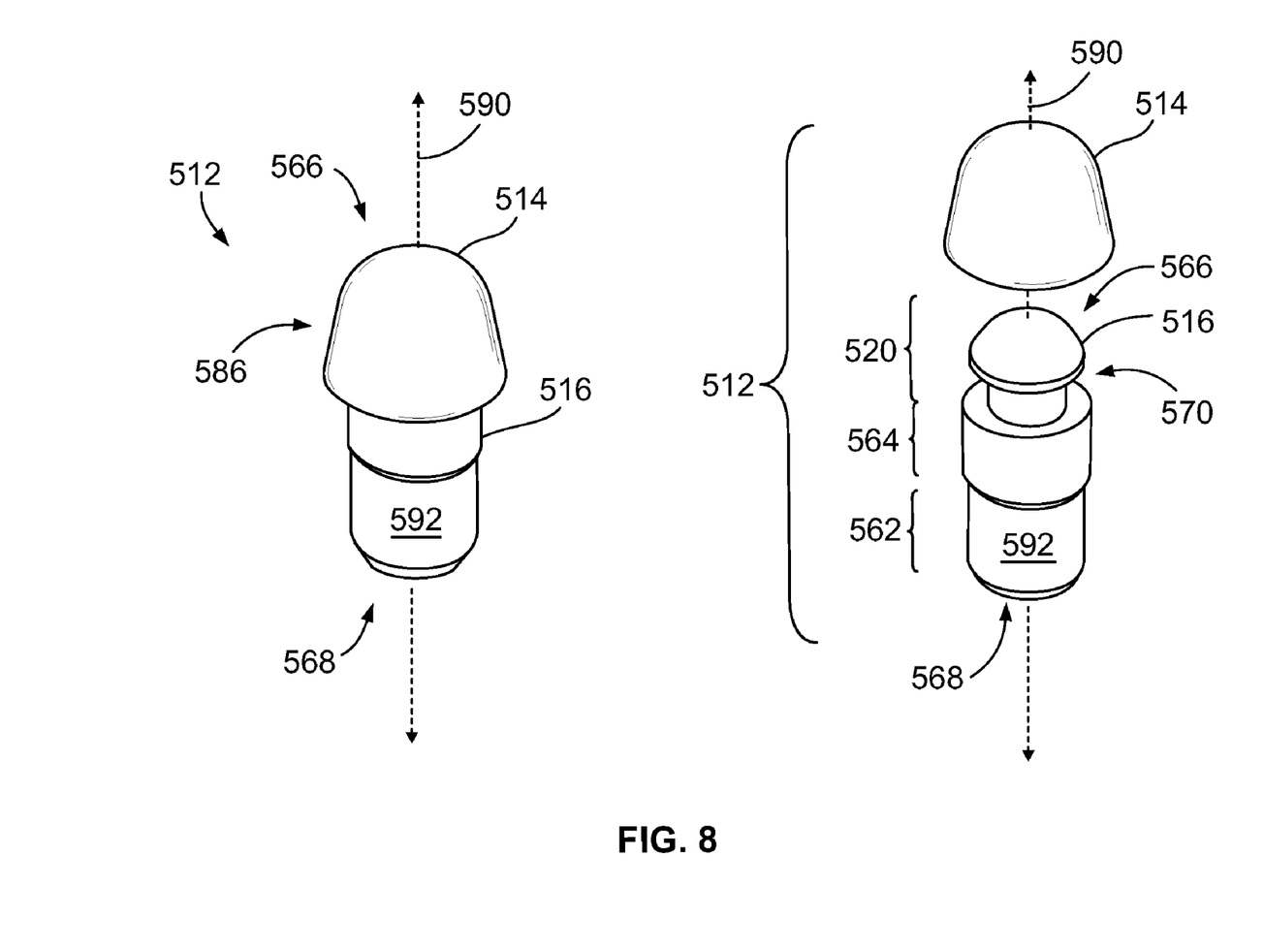
FIG. 8 illustrates another alignment member that may be used with the connector assembly in an alternative embodiment.

FIGS. 6-8 are perspective views of alternative alignment members that show an exploded view and assembled view of the corresponding alignment member. The alignment members described with reference to FIGS. 6-8 may be used with a connector assembly, such as the connector assembly 100 described above. More specifically, FIG. 6 illustrates an alignment member 312 that includes an elastic member 314 and a body component 316. As shown, the body component 316 extends between two ends 366 and 368 along an axis 390. The body component 316 may have a lateral surface 392 that surrounds the body component 316 around the axis 390. The body component 316 includes a head 320, a tail 362, and a post 364 that joins the head 320 and the tail 362. As described above with respect to the alignment member 112, the tail 362 is optional. The head 320 of the body component 316 may include a pair of slots 370 and 372 that extend through the head 320 and intersect each other along the axis 390. The slots 370 and 372 may have a depth $D_P$ that extends from the end 366 into the head 320 in an axial direction. As shown, the slots 370 and 372 form a cross-like opening that is configured to receive the elastic member 314.

As shown in FIG. 6, the elastic member 314 may have a cross-like shape formed by a pair of walls 380 and 382. The walls 380 and 382 intersect each other and are configured to be inserted into the slots 370 and 372 of the head 320. When the elastic member 314 is fully inserted, protruding portions 384 of the walls 380 and 382 project radially outward away from the axis 390 beyond the lateral surface 392. When the alignment member 312 is in use, the protruding portions 384 may engage the module, such as the module 102, when the module is mounted onto a connector. Furthermore, in some embodiments, the posts 364 of the alignment member 312 may be rotatable within the corresponding hole of the substrate. As such, the protruding portions 384 may be rotated toward or away from an edge or corner of the module that the alignment member 312 engages.

FIG. 7 illustrates an alignment member 412 that includes an elastic member 414 and a body component 416. As shown, the body component 416 extends between two ends 466 and 468 along an axis 490. The body component 416 may have a lateral surface 492 that surrounds the body component 416 around the axis 490. The body component 416 includes a head 420, an optional tall 462, and a post 464 that joins the head 420 and the tail 462. The head 420 of the body component 416 may have a groove 470 that extends circumferentially around the body component 416 and around the axis 490.

The elastic member 414 may have a ring- or band-like shape and may be snap-fit onto the head 420 such that the elastic member 414 is retained within, the groove 470. When the elastic member 414 is coupled to the head 420, the elastic member 414 may have a protruding portion 484 that projects radially outward away from the axis 490 beyond the lateral surface 492. The protruding portion 484 may also have a lateral surface 486. Similar to the lateral surface 172 and the top surface 122 described above, the lateral surface 486 may form an obtuse angle with respect to a top surface of the module. When the alignment member 412 is in use, the protruding portion 484 may engage a module when the module is mounted onto a connector.

FIG. 8 illustrates an alignment member 512 that includes an elastic member 514 and a body component 516. As shown, the body component 516 extends between two ends 566 and 568 along an axis 590. The body component 516 may have a lateral surface 592 that surrounds the body component 516 around the axis 590. The body component 516 includes a head 520, an optional tail 562, and a post 564 that joins the head 520 and the tail 562. The head 520 of the body component 516 may have a groove 570 that extends circumferentially around the body component 516 and around the axis 590. Furthermore, the end 566 may be dome-shaped.

The elastic member 514 may be shaped like a cap and may be snap-fit onto the head 520. When the elastic member 514 is coupled to the head 520, the elastic member 514 may surround the head 520. The elastic member 514 may also have a lateral surface 586. Similar to the lateral surface 172 and the top surface 122 described above, the lateral surface 586 may form an obtuse angle with respect to a top surface of the module. When the alignment member 512 is in use, the lateral surface 586 may engage the module when the module is mounted onto a connector.

Figure 9:
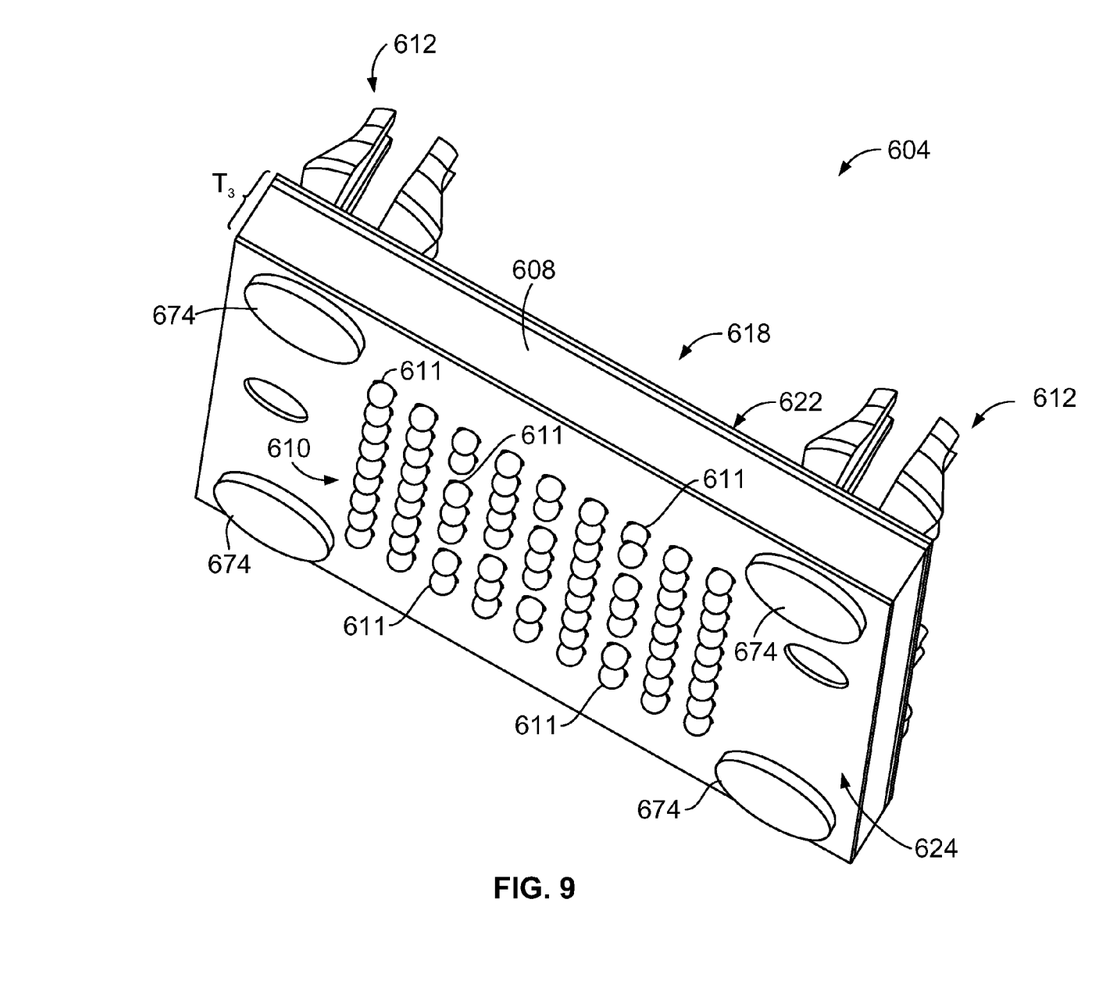
FIG. 9 is a bottom perspective view of an electrical connector formed in accordance with another embodiment.

FIG. 9 is a bottom perspective view of an electrical connector 604 formed in accordance with another embodiment that may be used to interconnect an electronic module and an electrical component, such as the module 102 and the electrical component 106 shown in FIG. 1. The connector 604 includes an interposer or substrate 608 having a thickness $T_3$ that extends between opposite surfaces 622 and 624. The substrate 608 may have an array of interconnects 610 extending therethrough. The interconnects 610 are configured to electrically couple the module and the electrical component in communication with each other. However, only a portion of the interconnects 610 are shown in FIG. 9 and, in particular, only tails or solder bails 611 of the interconnects 610 are shown. The solder balls 611 are configured to be soldered to corresponding contacts of the electrical component. In alternative embodiments, other types of interconnects, such as those described above, maybe used with the connector 604.

The connector 604 may also include a plurality of alignment members 612 that are coupled to the substrate 608. In the illustrated embodiment, the substrate 608 includes multiple layers and may have similar features as described above with respect to the substrate 108 (FIG. 1). The connector 604 is configured to receive and hold the module in a mounted position so that the module has a predetermined position and orientation relative to the substrate 608. For example, the alignment members 612 may be located relative to each other in order to collectively form a module reception area 618 where the module is held in the predetermined position and orientation with respect to the substrate 608. Also shown in FIG. 9, the alignment members 612 may include spacers 674 mat extend alongside the surface 624. The spacers 674 are configured to interface with or support the connector upon the electrical component.

Figure 10:
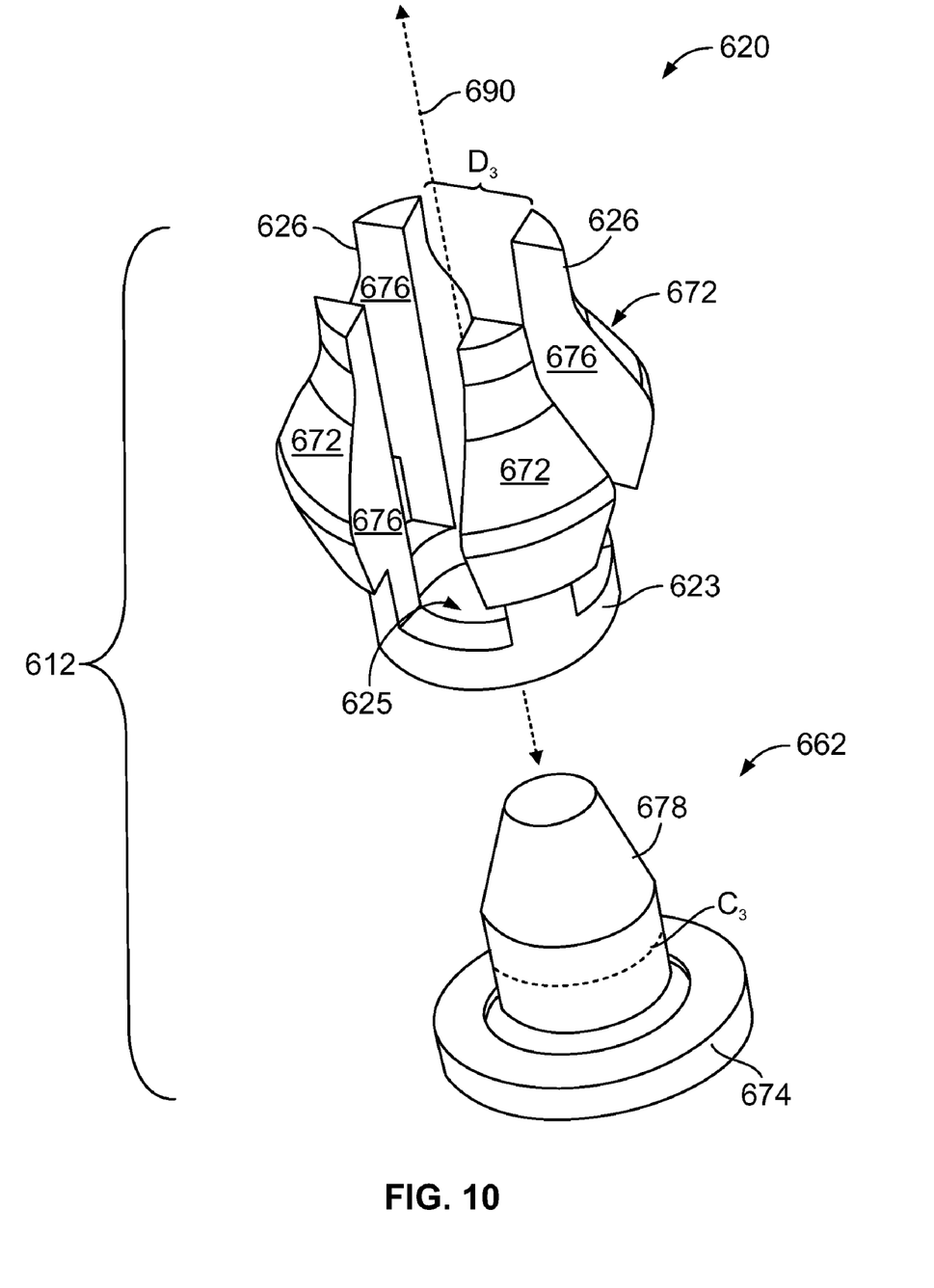
FIG. 10 is an exploded view of an alignment member that may be used the connector shown in FIG. 9.

FIG. 10 is an isolated exploded view of the alignment member 612. As shown, the alignment member 612 includes a head 620 and, optionally, a separable base or tail 662. In alternative embodiments, the head 620 and the tail 662 maybe integrally formed as one unit. The head 620 may be similarly sized as the other heads described above and may extend along a longitudinal or central axis 690. The head 620 may include a collar 623 that extends about the central axis 690 and has an opening 625 that is sized and shaped to receive the tail 662.

The head 620 of each alignment member 612 may also include a plurality of fingers 626 that extend away from the collar 623 and longitudinally along the central axis 690. Each finger 626 may include a lateral surface 672 that faces away from the central axis 690. Each finger 626 may also have an interior surface 676 that faces at least one of the central axis 690 and another interior surface 676 of an adjacent finger 626. The lateral surface 672 is configured to engage the module, whereas the interior surface 676 is not configured to engage the module. The fingers 626 may comprise a flexible or compressible elastic material.

The fingers 626 may be equally distributed or spaced part from each other along the collar 623. For example, each finger 626 may be spaced apart from an adjacent finger 626 a distance $D_3$. However, in alternative embodiments, the fingers 626 are not equally distributed about the collar 623. As shown in FIG. 10, the fingers 626 are in a relaxed or unengaged position. The distance $D_3$ may be configured to provide enough space for a finger 626 to be moved from me relaxed position (i.e., flexed toward the central axis 690) without being obstructed by an adjacent linger 626. Furthermore, the distance $D_3$ may also be at least partially determined by a desired resilience or flexibility of the fingers 626. More specifically, the fingers 626 may be sized and shaped to provide a resilient force against the module when the module is mounted to the connector in order to form an interference fit between the module and the plurality of alignment members 612.

Also shown in FIG. 10, the tail 662 may include the spacer 674 and a plug body 678 that projects away from the spacer 674 in an axial direction (i.e., along the central axis 690 when the tail 662 and head 620 are coupled together). The plug body 678 may have a cross-section $C_3$ that is sized and shaped to fit within the opening 625 of the collar 623. The plug body 678 may taper as the plug body 678 extends away from the spacer 674. More specifically, a size of the cross-section $C_3$ may reduce as the plug body 678 extends away from the spacer 674.

Figure 11:
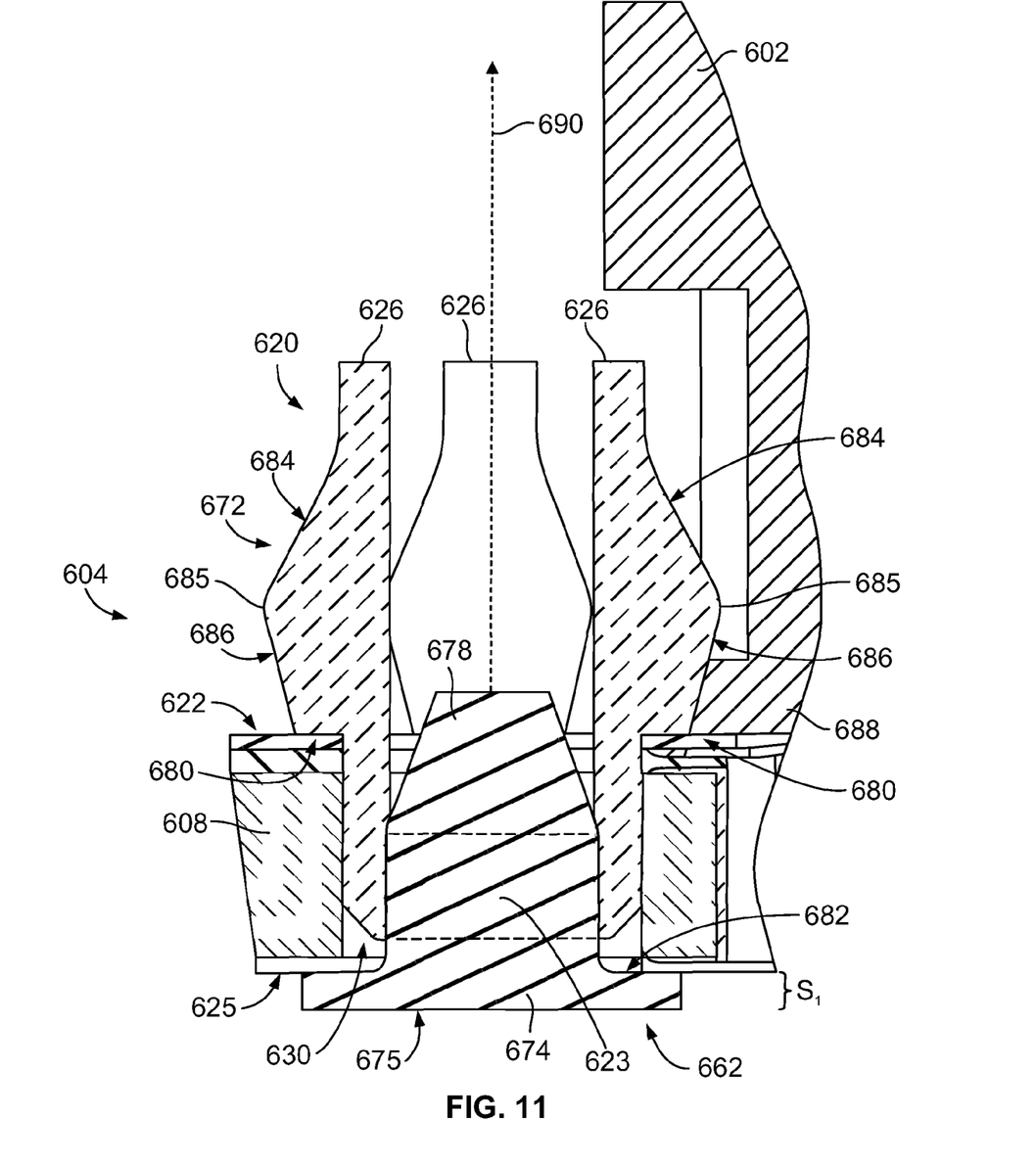
FIG. 11 is a cross-sectional side view of a portion of the connector of FIG. 9 engaged with an electronic module.

FIG. 11 is a cross-sectional side view of a portion of the connector 604 when an electronic module 602 is mounted onto the connector 604. In order to assemble the connector 604, the head 620 may be inserted through a hole 630 of the substrate 608 proximate the surface 622, and the tail 662 may be inserted through the hole 630 proximate the opposite surface 624. As shown, the fingers 626 may have corresponding ledge surfaces 680 that interface with and rest upon the surface 622 when the head 620 is inserted into the hole 630. The plug body 678 of the tail 662 may be advanced through the opening 625 (FIG. 9) and form an interference fit with the collar 623 and/or fingers 626. The spacer 674 may have a ledge surface 682 that interfaces with the surface 624 of the substrate 608. Accordingly, the substrate 608 may be sandwiched between the ledge surfaces 680 of the fingers 626 and the ledge surface 682 of the spacer 674.

The lateral surfaces 672 of the fingers 626 have a curved contour or shape. More specifically, the lateral surfaces 672 may have a mating surface 684 that faces away from the surface 622 of the substrate 608 and a gripping surface 686 that faces toward the surface 622. As shown in FIG. 11, as the mating and gripping surfaces 684 and 686 extend toward each other, the mating and gripping surfaces 684 and 686 extend away from the central axis 690 and join each other at an apex 685.

When the module 602 is mounted onto the connector 604, a module edge 688 initially engages the mating surface 684. In the illustrated embodiment, only one or two of the fingers 626 may engage the module edge 688. The finger(s) 626 that engage the module edge 688 are pressed toward the central axis 690 to allow the module 602 to be mounted onto the connector 604. When the module edge 688 clears the apex(es) 685 of the corresponding fingers 626, the finger(s) 626 flex back toward the relaxed position (i.e., away from the central axis 690). As the finger 626 returns to the relaxed position, the gripping surface 686 presses against the module edge 688. Collectively, the fingers 626 of the different alignment members 612 that engage the module 602 form an interference fit with the module 602 to hold the module in the predetermined position and orientation.

Also shown in FIG. 11, the spacer 674 is configured to provide a separation or spacing $S_1$ between the surface 624 and a surface (not shown) of the electrical component. The spacer 674 also has a mounting surface 675 that interlaces with the surface of the electrical component. The spacing $S_1$ is configured to prevent creeping and allow the solder balls 611 (FIG. 9) to be soldered to the component. The spacing $S_1$ may also be configured to prevent overcompression of the solder balls and any underlying circuitry.

Figure 12:
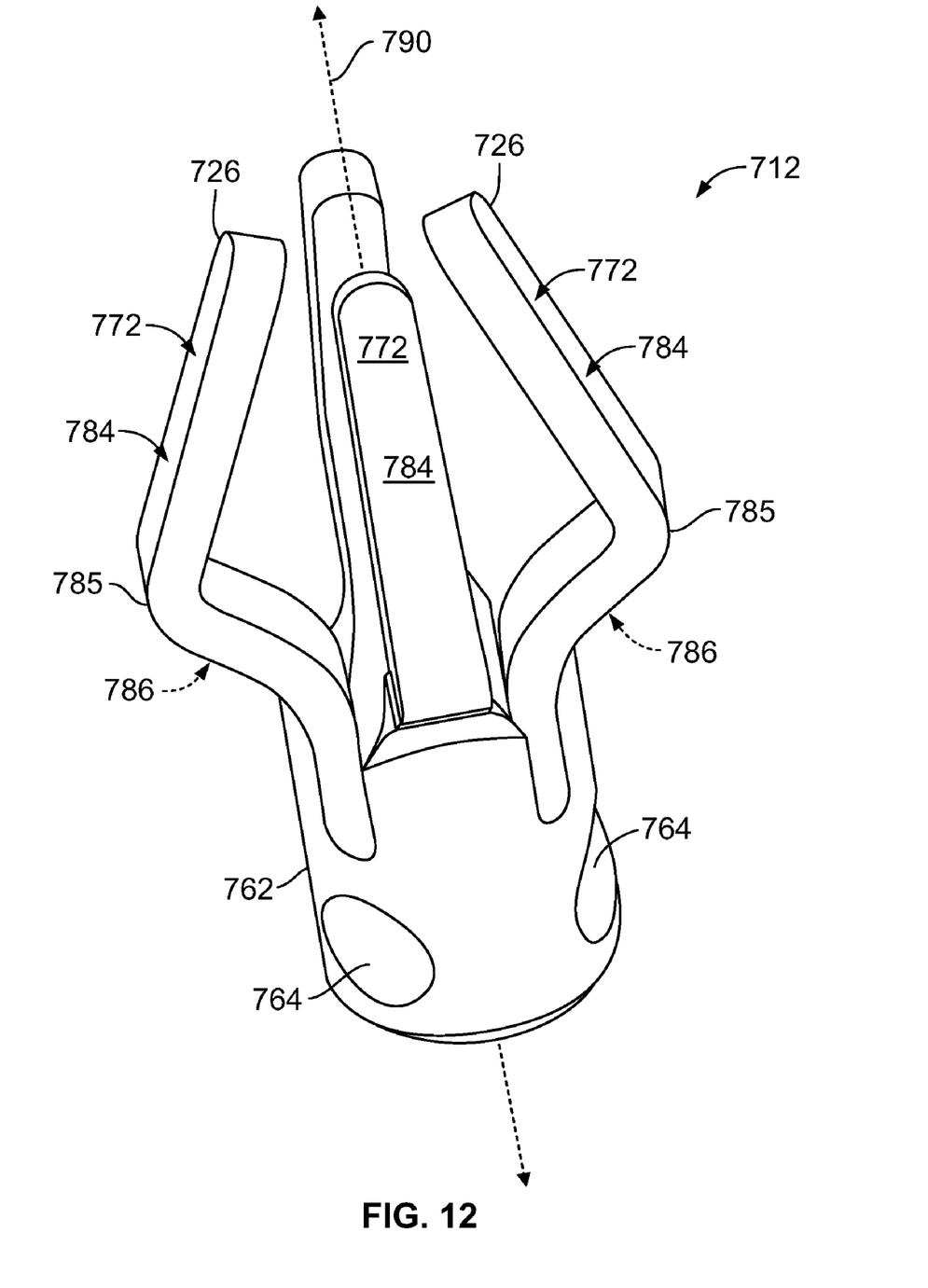
FIG. 12 is a perspective view of an alignment member formed in accordance with another embodiment.

FIG. 12 is a perspective view of an alignment member 712 that may be used with the connectors 104 (FIG. 1) and 604 (FIG. 9) described above. In the illustrated embodiment, the alignment member 712 is stamped and formed from a sheet material (e.g., metal alloy). However, in alternative embodiments, the alignment member 712 may be manufactured or formed by other processes and materials. As shown, the alignment member 712 extends along a central axis 790 and includes a base 762 that is configured to be inserted into and engage a hole (not shown) of a connector (not shown), such as the connectors 104 and 604 described above. The base 762 may have protrusions 764 that engage interior surfaces of the hole in order to form an interference fit with the hole. The alignment member 712 may also include ringers 726 that project away from the base 762 along the central axis 790.

As shown, the fingers 726 extend toward and away from the central axis 790 and include a lateral surface 772 configured to engage an electronic module (not shown) as described above. The lateral surfaces 772 of the fingers 726 may have a contour or shape that is configured to engage and grip the module. More specifically, each lateral surface 772 may have a mating surface 784 and a gripping surface 786 that face at least partially away from each other. The mating and gripping surfaces 784 and 786 extend away from the central axis 790 and join each other at an apex 785. When the module is mounted onto the connector, the finger(s) 726 are configured to flex toward the central axis 790. When the module clears the apex(es) 785 of the corresponding fingers 726, the finger 726 may flex back toward the unengaged position (i.e., away from the central axis 790). As the fingers 726 return to the unengaged position, the gripping surface 786 may press against the module. Collectively, the fingers 726 of the different alignment members 712 that engage the module may form an interference fit with the module to hold the module in the predetermined position and orientation.

Although the alignment member 712 is shown as having a unitary structure, the alignment member 712 may include separate components in alternative embodiments. For example, the alignment member 712 as shown in FIG. 12 may be a head that receives a base or tail as described with respect to the alignment member 612.

It is to be understood that the above description is intended to be illustrative, and not restrictive. As such, the above-described embodiments (and/or aspects thereof) may be used in combination with each other. For example, features described and/or shown with respect to the alignment members 112, 312, 412, 512, 612, and 712 may be incorporated and used in combination with each other. Furthermore, each of the alignment members 112, 312, 412, 512, 612, and 712 may be used with the substrate 108 or 608 to form an electrical connector.

In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector for electrically coupling an electronic module and an electrical component, the connector comprising:
    a substrate having first and second surfaces separated by a thickness, the substrate including interconnects extending through the substrate, the interconnects being arranged in an array, the interconnects being configured to engage the module along the first surface and engage the electrical component along the second surface; and
    alignment members extending through openings in the substrate, the alignment members including heads that project beyond and away from the first surface, the heads being located about the substrate relative to each other to collectively form a module reception area therebetween to hold the module in a predetermined position and orientation with respect to the first surface and with respect to the interconnects;
    wherein at least one of the heads includes a lateral surface that engages the module, the lateral surface forming an obtuse angle with respect to the first surface, and wherein the lateral surface has an elastic material.

2. The connector in accordance with claim 1 wherein the heads are positioned on the substrate to hold the module therebetween, the heads forming an interference fit with the module.

3. The connector in accordance with claim 1 wherein the substrate includes a contact region located between the heads along the first surface where the interconnects are located, each head including a lateral surface configured to engage the module.

4. The connector in accordance with claim 1 wherein the substrate includes a contact region located between the heads along the first surface where the interconnects are located, the alignment members positioned on the substrate to surround the contact region.

5. The connector in accordance with claim 1 wherein each of the heads includes a corresponding lateral surface that engages the module, each of the corresponding lateral surfaces forming an obtuse angle with respect to the first surface and having an elastic material.

6. The connector in accordance with claim 1 wherein the substrate includes at least one hole that extends into the thickness of the substrate from a corresponding opening, at least one of the alignment members extending into the hole through the thickness of the substrate.

7. The connector in accordance with claim 6 wherein the at least one alignment member is rotatable within the corresponding hole.

8. The connector in accordance with claim 6 wherein the at least one alignment member extends through the hole and has a tail that projects beyond and away from the second surface.

9. The connector in accordance with claim 1 wherein each interconnect comprises a beam that resiliently flexes away from the first surface, the beam flexing a distance away from the first surface.

10. The connector in accordance with claim 1 wherein at least one alignment member includes an elastic member comprising an elastic material, the elastic member configured to engage the module.

11. The connector in accordance with claim 1 wherein at least one of the heads comprises a plurality of fingers that project beyond and away from the first surface, the module engaging at least one of the fingers when the module is held in the predetermined position and orientation.

12. An electrical connector assembly comprising:
an electronic module including mating contacts that extend along a mating face of the module;
an electrical component including mating contacts that extend along a mating face of the electrical component; and
an electrical connector comprising:
a substrate configured to be mounted onto the electrical component, the substrate having first and second surfaces separated by a thickness, the substrate including interconnects extending through the substrate, the interconnects being arranged in an array, the interconnects being configured to engage the module along the first surface and engage the electrical component along the second surface; and
alignment members extending through openings in the substrate, the alignment members including heads that project beyond and away from the first surface, the heads being located about the substrate relative to each other to collectively form a module reception area therebetween to hold the module in a predetermined position and orientation with respect to the first surface and with respect to the interconnects;
wherein at least one of the heads includes a lateral surface that engages the module, the lateral surface forming an obtuse angle with respect to the first surface, and wherein the lateral surface has an elastic material.

13. The connector assembly in accordance with claim 12 wherein the heads are positioned on the substrate to hold the module therebetween, the heads forming an interference fit with the module.

14. The connector assembly in accordance with claim 12 wherein the substrate includes a contact region located between the heads along the first surface where the interconnects are located, each head including a lateral surface that is configured to engage the module.

15. The connector assembly in accordance with claim 12 wherein the substrate includes a contact region located between the heads along the first surface where the interconnects are located, the alignment members positioned on the substrate to surround the contact region.

16. The connector assembly in accordance with claim 12 wherein at least one of the heads comprises a plurality of fingers that project beyond and away from the first surface, the module engaging at least one of the fingers when the module is held in the predetermined position and orientation.

17. The connector assembly in accordance with claim 12 wherein each of the heads includes a corresponding lateral surface that engages the module, each of the corresponding lateral surfaces forming an obtuse angle with respect to the first surface and having an elastic material.

18. The connector in accordance with claim 1 wherein the lateral surface comprises a mating surface that faces away from the first surface and a gripping surface that faces toward the first surface, the mating surface forming the obtuse angle with respect to the first surface.

* * * * *